United States Patent
Knappe et al.

(10) Patent No.: US 8,995,052 B1
(45) Date of Patent: Mar. 31, 2015

(54) MULTI-STAGE MOPA WITH FIRST-PULSE SUPPRESSION

(71) Applicant: Coherent Kaiserslautern GmbH, Kaiserslautern (DE)

(72) Inventors: Ralf Knappe, Trippstadt (DE); Albert Seifert, Kaiserslautern (DE); Alexander Weis, Kaiserslautern (DE)

(73) Assignee: Coherent Kaiserslautern GmbH, Kaiserslautern (DE)

( * ) Notice: Subject to any disclaimer, the term of this patent is extended or adjusted under 35 U.S.C. 154(b) by 19 days.

(21) Appl. No.: 14/022,129

(22) Filed: Sep. 9, 2013

(51) Int. Cl.
*H01S 3/23* (2006.01)
*H01S 3/10* (2006.01)
*H01S 3/11* (2006.01)
*H01S 5/04* (2006.01)

(52) U.S. Cl.
CPC ...................................... *H01S 5/041* (2013.01)
USPC ............. 359/341.3; 359/346; 372/70; 372/92

(58) Field of Classification Search
CPC ..... H01S 3/2308; H01S 3/10046; H01S 3/11; H01S 3/08072; H01S 3/091; H01S 3/0813
USPC ............ 359/333, 346, 349, 341.3; 372/70, 92
See application file for complete search history.

(56) References Cited

U.S. PATENT DOCUMENTS 3,267,385 A * 8/1966 Ashkin ........................... 330/4.6
4,337,442 A 6/1982 Mauck
4,416,226 A * 11/1983 Nishida et al. ............ 123/143 B
5,046,070 A * 9/1991 Negus .............................. 372/33
5,226,051 A 7/1993 Chan et al.
5,255,275 A * 10/1993 Motegi ............................. 372/99
5,321,715 A * 6/1994 Trost ................................ 372/69
5,339,323 A * 8/1994 Hunter et al. .................... 372/25
5,376,770 A * 12/1994 Kuhl et al. ............... 219/121.83
5,756,924 A * 5/1998 Early ............................ 102/201
5,812,569 A 9/1998 Walker et al.
5,933,271 A 8/1999 Waarts et al.

(Continued)

FOREIGN PATENT DOCUMENTS

EP       1734622 A1   12/2006
WO   2006/057660 A2    6/2006
WO   2007/134635 A1   11/2007

OTHER PUBLICATIONS

Coherent Inc., "Rapid Laser Product Brochure, Represents Systems Sold Prior to Dec. 2011, See Discussion", Rapid, High-Power Industrial Picosecond Laser, 2013, 2 pages.

*Primary Examiner* — Ari M Diacou
(74) *Attorney, Agent, or Firm* — Morrison & Foerster LLP

(57) ABSTRACT

A solid-state MOPA includes a mode-locked laser delivering a train of pulses. The pulses are input to a fast E-O shutter, including polarization-rotating elements, polarizing beam-splitters, and a Pockels cell that can be driven alternatively by high voltage (HV) pulses of fixed long and short durations. A multi-pass amplifier follows the E-O shutter. The E-O shutter selects every Nth pulse from the input train and delivers the selected pulses to the multi-pass amplifier. The multi-pass amplifier returns amplified seed-pulses to the E-O shutter. The shutter rejects or transmits the amplified pulses depending on whether the HV-pulse duration is respectively short or long. Transmitted amplified pulses are delivered to a transient amplifier configured for separately suppressing first-pulse over-amplification and residual pulse leakage.

16 Claims, 8 Drawing Sheets

(56) References Cited

U.S. PATENT DOCUMENTS

| | | | |
|---|---|---|---|
| 6,038,240 A * | 3/2000 | Deutsch et al. | 372/25 |
| 6,038,241 A * | 3/2000 | von Elm et al. | 372/30 |
| 6,064,514 A | 5/2000 | Aoki et al. | |
| 6,172,801 B1 | 1/2001 | Takeda et al. | |
| 6,193,711 B1 * | 2/2001 | Connors et al. | 606/12 |
| 6,382,957 B1 * | 5/2002 | Early et al. | 431/1 |
| 6,385,218 B1 * | 5/2002 | Sasaki et al. | 372/25 |
| 6,414,980 B1 * | 7/2002 | Wang et al. | 372/92 |
| 6,683,893 B2 * | 1/2004 | Wang | 372/10 |
| 6,831,936 B1 * | 12/2004 | Smart | 372/26 |
| 7,031,352 B2 | 4/2006 | Palmer et al. | |
| 7,173,212 B1 * | 2/2007 | Semak | 219/121.69 |
| 7,348,516 B2 * | 3/2008 | Sun et al. | 219/121.61 |
| 7,460,566 B2 | 12/2008 | Kennedy | |
| 7,616,669 B2 | 11/2009 | Grant et al. | |
| 7,649,667 B2 | 1/2010 | Bergmann et al. | |
| 7,649,924 B2 | 1/2010 | Clubley et al. | |
| 7,692,854 B2 | 4/2010 | Clubley et al. | |
| 7,817,685 B2 * | 10/2010 | Osako et al. | 372/25 |
| 7,876,498 B1 | 1/2011 | Honea et al. | |
| 8,125,704 B2 * | 2/2012 | Mielke et al. | 359/341.1 |
| 8,149,886 B2 | 4/2012 | Kopf et al. | |
| 8,309,885 B2 * | 11/2012 | Peng et al. | 219/121.73 |
| 8,526,473 B2 * | 9/2013 | Baird et al. | 372/25 |
| 8,598,490 B2 * | 12/2013 | Hooper et al. | 219/121.69 |
| 8,717,670 B2 * | 5/2014 | Starodoumov et al. | 359/341.1 |
| 2002/0167974 A1 * | 11/2002 | Kennedy et al. | 372/10 |
| 2004/0042061 A1 | 3/2004 | Islam et al. | |
| 2005/0067388 A1 * | 3/2005 | Sun et al. | 219/121.61 |
| 2006/0126678 A1 * | 6/2006 | Sun et al. | 372/30 |
| 2009/0245300 A1 | 10/2009 | Sun et al. | |
| 2009/0245302 A1 * | 10/2009 | Baird et al. | 372/25 |
| 2011/0019705 A1 * | 1/2011 | Adams et al. | 372/25 |
| 2011/0122483 A1 | 5/2011 | Lundquist et al. | |
| 2013/0272325 A1 * | 10/2013 | Rosenthal et al. | 372/25 |

* cited by examiner

MULTI-STAGE MOPA WITH FIRST-PULSE SUPPRESSION

TECHNICAL FIELD OF THE INVENTION

The present invention relates in general to first pulse suppression in solid-state laser systems. The invention relates in particular to first-pulse suppression and pulse-selection in solid-state, pulsed, master oscillator power amplifier (MOPA systems) using a mode-locked master oscillator.

DISCUSSION OF BACKGROUND ART

A high-power short pulse (a few picoseconds or less) solid-state MOPA system for material processing applications typically includes a mode-locked master oscillator which provides seed-pulses in a train at a pulse repetition rate (PRF) of several megahertz (MHz). A pulse-picker is provided for selecting single pulses or bursts of pulses from the seed-pulse train for further amplification at a lower PRF, for example, hundreds of kilohertz (kHz). The selected pulses are amplified by one or more solid-state amplifier stages. A fast process shutter, usually an electro-optic (EO) modulator is used to select from the amplified pulses, those that are delivered to material being processed.

The fast process shutter adds significant cost and complexity to such a MOPA system. There is a need for a method and apparatus for operating such a MOPA system without a fast process shutter. This method and apparatus must avoid over-amplification of the first pulse in a train to be delivered to the material being processed.

SUMMARY OF THE INVENTION

In one aspect, optical apparatus in accordance with the present invention includes a mode-locked laser delivering a first train of pulses at a first pulse-repetition frequency (PRF). The apparatus includes at least one transient optical amplifier having a solid-state gain-element optically pumped by radiation output from a diode-laser array for energizing the gain-element. The diode laser has selectively variable output power. The apparatus further includes a multi-pass optical amplifier cooperative with an optical shutter. The optical shutter is arranged to select pulses from the first train thereof to provide a second train of pulses at a second PRF less than the first PRF, provide the selected pulses to the multi-pass amplifier to be amplified, receive a corresponding train of amplified pulses from the multi-pass amplifier and selectively transmit a plurality of pulses from the train of amplified pulses to the transient optical amplifier for further amplification. The amplified pulses in the plurality thereof have about equal amplitude. The diode-laser array power is set at a first level when amplified pulses are not being received to maintain about constant thermal lensing in the gain-element; set at a second level lower than the first level for a predetermined first time period in response to the plurality of pulses being selected for depleting stored energy in the gain-element; and set to a third level higher than the first level for a second time period prior to the arrival of the plurality of amplified pulses from the optical shutter to restore stored energy in the gain-element. The first and second time periods are selected such that, when further amplified, all further-amplified pulses in the plurality thereof have about equal amplitude. The transient amplifier has a laser resonator including the gain-element. The laser resonator generates CW radiation in response to the first-level pumping when amplified pulses are not being further amplified.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1:
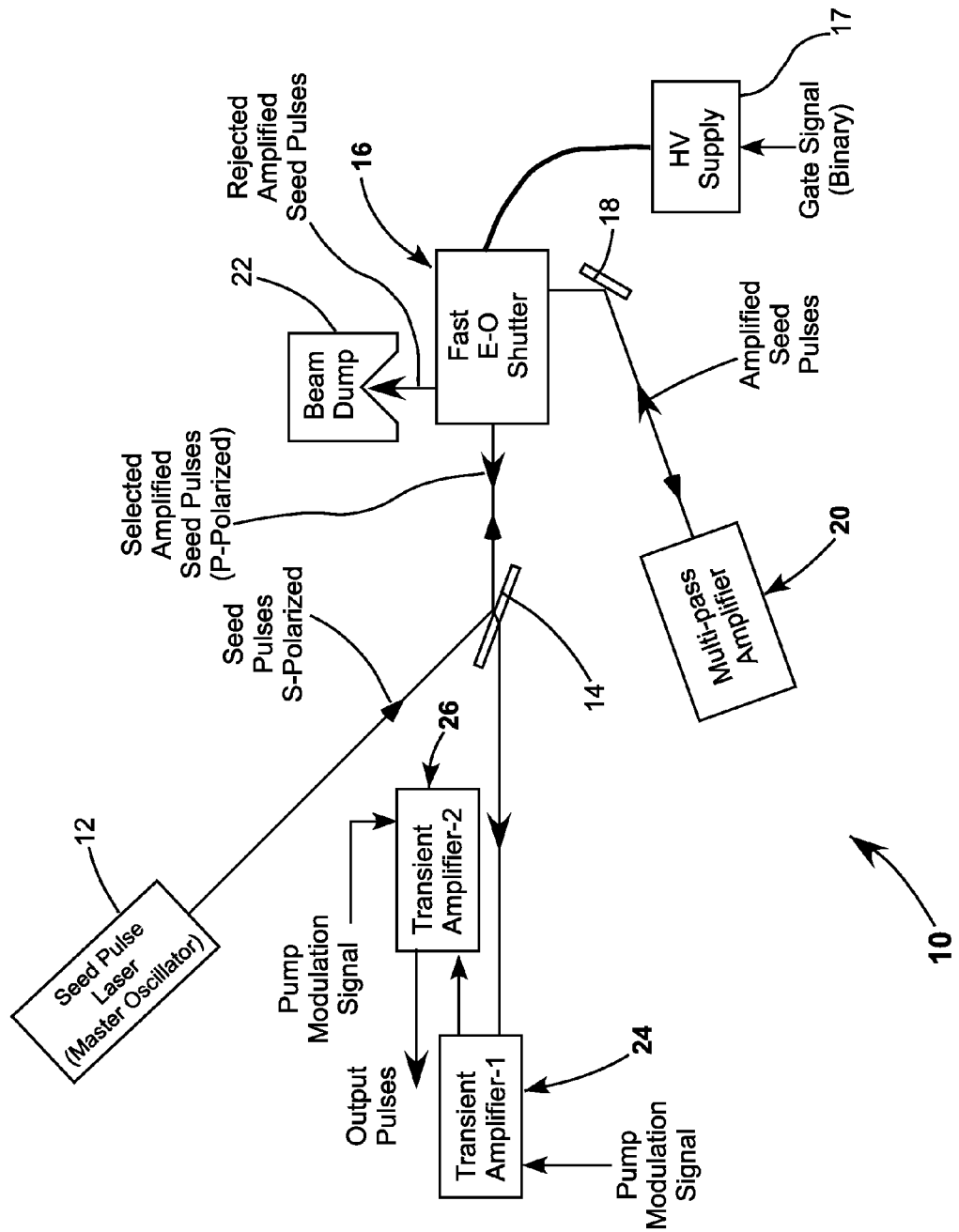
FIG. 1 schematically illustrates a MOPA in accordance with the present invention including a mode-locked master oscillator, followed by a Faraday Isolator, and delivering pulses at a first pulse-repetition frequency, a multi-pass amplifier, and a fast double-pass electro-optical (E-O) shutter between the master oscillator and first and second transient amplifier stages.

Referring now to the drawings, wherein like components are designated by like reference numerals, FIG. 1 schematically illustrates a master oscillator and power amplifier (MOPA) 10 in accordance with the present invention. MOPA 10 includes a mode-locked master oscillator (seed-pulse laser) delivering a train of pulses at a first pulse-repetition frequency (PRF). The first PRF is determined by the resonator length of the seed-pulse laser and may be between about 10 and 200 MHz. A preferred seed-pulse laser is a mode-locked neodymium-doped yttrium vanadate (NdYVO$_4$) laser providing seed-pulses of 10 picoseconds duration and pulse-energy of about 10 nanojoules (nj) at a PRF of 50 MHz. The seed-pulses are designated in FIG. 1 and other drawings by small non-barbed arrowheads.

The train of pulses from seed-laser 12 is directed by a front-surface polarizer (polarizing beam-splitter) 14 into a fast double-pass electro-optical (E-O) shutter 16. Shutter 16 is activated and deactivated by a DC high-voltage (HV) power supply 17, which is switched between on and off states in response to a binary gate-signal. One suitable such power supply is available from Bergmann Messgeraete Entwicklung (BME) of Murnau, Germany as Model dpp2b3. Here, it is assumed that the seed-pulses are plane-polarized with the polarization-plane perpendicular to the plane of the drawing, i.e., S-polarized with respect to front surface polarizer 14. E-O shutter 16 selects seed-pulses from the input train at a second PRF which is a sub-multiple of the first PRF. In this regard, the E-O shutter functions as the pulse-picker of the above-described prior-art MOPA.

The selected pulses are directed by a turning mirror 18 into a multi-pass solid-state amplifier 20. Amplifier 20 amplifies the selected seed-pulses and returns amplified seed-pulses via turning-mirror 18 to the fast E-O shutter. Amplified seed-pulses are designated by large, barbed arrowheads. Shutter 16 either rejects the amplified seed-pulses or transmits the amplified seed-pulses for further amplification according to the duration of the "on" state of the shutter. The selected amplified seed-pulses are returned to polarizer 14 with the polarization-plane of the amplified seed-pulses rotated by 90°. The selected amplified seed-pulses, accordingly, are transmitted by polarizer 14 to be further amplified, first by a transient solid-state amplifier 24, then by a transient solid-state amplifier 26. Each transient amplifier is supplied with a pump-modulation signal, the purpose of which is explained further hereinbelow.

It should be noted here that two transient amplifiers are depicted in MOPA 10, by way of example. Depending on pulse power required, and the configuration of the transient amplifiers, there may be only one transient amplifier, or more than two transient amplifiers without departing from the spirit and scope of the present invention.

Figure 2:
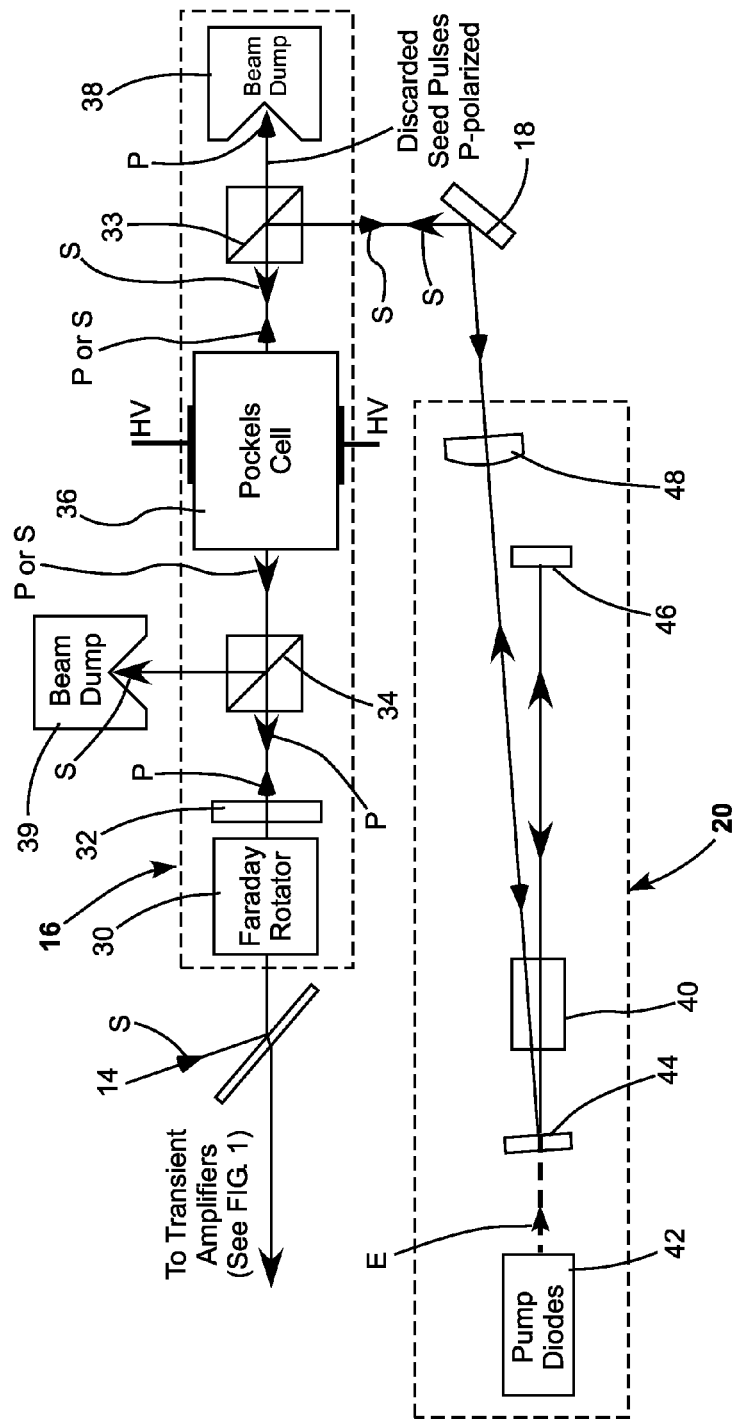
FIG. 2 schematically illustrates details of one preferred arrangement of the fast double-pass E-O shutter and multi-pass amplifier of FIG. 1, with the E-O shutter including a Faraday rotator, a half-wave plate, and a Pockels cell activated and deactivated by a switched high voltage power supply, and a functioning as a pulse-picker for selecting seed-pulses for amplification in the multi-pass amplifier and selecting amplified pulses for delivery to the first and second amplifier stages.

FIG. 2 schematically illustrates details of the fast double-pass E-O shutter and multi-pass amplifier of FIG. 1. In the drawing, the polarization-orientation of seed-pulses and amplified seed-pulses at various stages of progress is indicated by designating the representative arrowheads with the letters P for P-polarization, S for S-polarization or both, where one or the other orientation is determined by the binary switching state of the shutter.

Shutter 16 includes, listed in order of forward propagation of a seed-pulse, a Faraday rotator 30; a half-wave plate 32; a polarizing beam-splitter 34, here in a McNeille bi-prism (cube) form; a Pockels cell 36, which is switched by the HV-supply of FIG. 1; and a polarizing beam-splitter 33. Multi-pass amplifier 20 includes a focusing lens 48; a solid state gain-element 40, for example a Nd:YVO$_4$ gain-element; a pump-through mirror 44; and an end-mirror 46. In this configuration, a seed-pulse to be amplified, directed into the amplifier by beam-splitter 33 and turning mirror 18, makes four passes through the gain-element and is returned along the original incidence path to mirror 18 and back into shutter 16. The polarization-orientation of the pulse stays the same during the amplification and return thereof. The amplifier gain-element is energized by radiation E from pump-diode-lasers 42. Pump through mirror 44 is highly reflective for the wavelength of the seed-pulses (and the amplifier gain wavelength) and highly transmissive for the diode-laser wavelength.

The combination of Faraday rotator 30 and half-wave plate 32 imparts a net, effective 90° rotation of the polarization-orientation of a seed-pulse, here from S-polarized to P-polarized in the forward (into the shutter) direction. The combination of Faraday rotator 30 and half-wave plate 32 imparts a net effective zero rotation of the polarization-orientation in the reverse (out of the shutter) direction. Pockels cell 36 provides net effective 90° rotation of the polarization-orientation of a pulse in the forward direction or net effective zero or 90° rotation of the polarization-orientation in the reverse direction dependent on the switching state of the high-voltage supply.

If during forward passage of a seed-pulse the Pockels cell is switched to provide zero polarization rotation, the seed-pulse will be transmitted by polarizing beam-splitter 33 to be caught by a beam-dump 38. If during forward passage of a seed-pulse, the Pockels cell is switched to provide effective 90° polarization rotation, the seed-pulse (s-polarized) will be reflected out of the shutter by polarizing beam-splitter 33 to be directed by mirror 18 into the multi-pass amplifier.

An amplified seed-pulse returned to shutter 16 by multi-pass amplifier 20 has the same polarization-orientation (S-polarization) as the original seed-pulse and is reflected by polarizing beam-splitter 33 back to Pockels cell 36. The amplified pulse, on leaving the Pockels cell, will be either S-polarized or P-polarized, depending on whether the Pockels cell is switched to prove respectively net 90° or net zero polarization rotation. If there is net zero rotation, the amplified seed-pulse will remain S-polarized and will be reflected by polarizing beam-splitter 34 into beam-dump 39.

If the Pockels cell is switched to provide net 90° rotation, the polarization-orientation of the amplified seed-pulse will be switched from S-polarized to P-polarized and will be transmitted by polarizing beam-splitter 34. As the combination of Faraday rotator 30 and half-wave plate 32 provides net zero polarization rotation in the reverse direction, after passage through the half-wave plate and the Faraday rotator, the amplified seed-pulse is transmitted by polarizing beam-splitter 14 to the transient amplifier stages of FIG. 1. A description of the actual operation of shutter 16 is set forth below with reference to FIG. 2A and FIG. 2B.

Figure 2A:
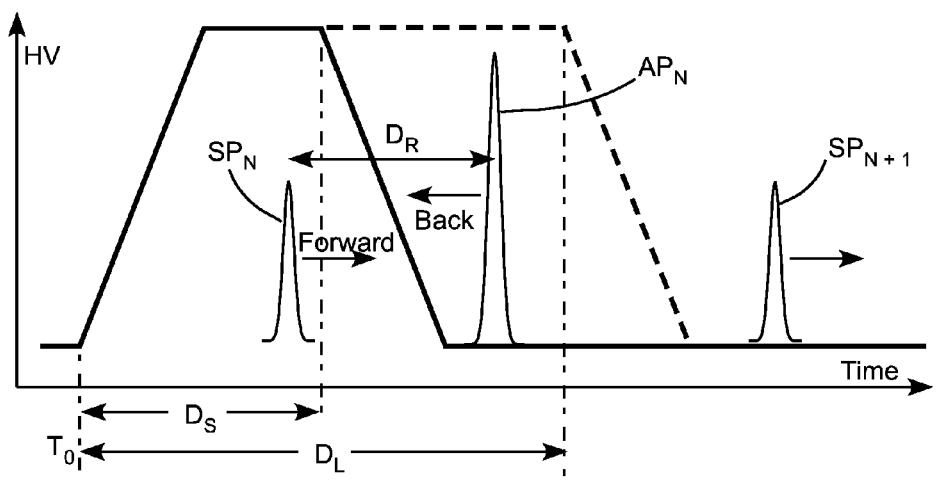
FIG. 2A is a graph of Pockels cell voltage as a function of time in the double-pass E-O shutter of FIG. 2 schematically illustrating selection of a seed-pulse for amplification, rejection of the amplified seed-pulse, and disposal of a subsequent seed-pulse.

FIG. 2A schematically depicts first and second durations $D_S$ (short) and $D_L$ (long) for HV (voltage-pulse) application to the Pockels cell of FIG. 2. These durations are measured from the instant of turning the HV on to the instant of turning the HV off. The actual (steady-state) duration of the HV application is DS or DL minus the rise-time of the voltage pulse. Here, it is assumed that the HV application causes net 90° polarization rotation, which, of course, is independent of propagation-direction. In FIG. 2A the HV is applied to the Pockels cell only for the short duration $D_S$ such that the polarization-orientation of a seed-pulse $SP_N$ in a train thereof from the seed-laser is rotated net 90°. Rotating the polarization-plane of the seed-pulse causes the seed-pulse to be sent to the multi-pass amplifier for amplification. HV is switched off, and falls to zero (or some low state) before the amplified pulse returns to the Pockels cell. As such, the polarization-orientation of the amplified seed-pulse $AP_N$ stays S-polarized after a return path through the Pockels cell, and is rejected (reflected) out of switch 16 by polarizing-beam-splitter 34 (see FIG. 2). Gain in the amplifier gain-element will, however, have been depleted by the amplification of the seed-pulse. The amplified seed-pulse traverses the Pockels cell at a time $D_R$ after the corresponding seed-pulse has traversed the Pockels cell. $D_R$, of course depends on the optical path length of the seed-pulse from the Pockels cell through the amplifier and back to the Pockels cell It can also be seen in FIG. 2A that HV is not turned back on until at least the next seed-pulse ($SP_{N+1}$) in the train thereof from the seed-pulse laser has traversed the Pockels cell, at least pulse-$SP_{N+1}$ is not polarization-rotated by the Pockels cell and is transmitted by polarizing beam-splitter 33 as discussed above with reference to FIG. 2 Accordingly, by synchronizing the HV switching with the seed-pulsed laser PRF every $M^{th}$ seed-pulse can be transmitted to the amplifier in a train thereof having a PRF one $M^{th}$ that of the seed-pulse laser PRF. This provides a pulse-picker function for the inventive MOPA. In steady state operation, the pump-power supplied to the multi-pass amplifier gain-element can be balanced with the PRF of the "picked" (delivered to the multi-pass amplifier) seed-pulses such that all amplified seed-pulses have the same amplitude, whether or not the amplified seed-pulses are selected for delivery to the transient amplifier stages of FIG. 1. This eliminates the giant-pulse effect of a first-delivered amplified pulse in a train, regular or irregular.

Figure 2B:
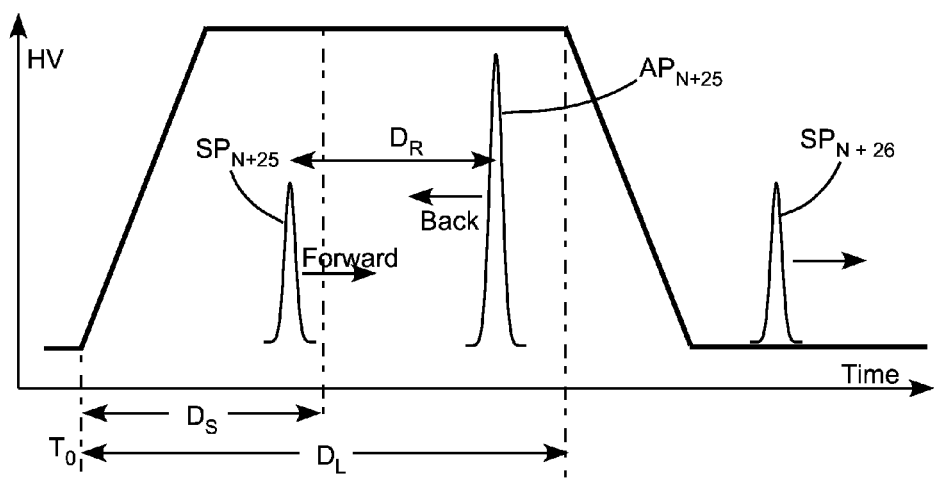
FIG. 2B is a graph of Pockels cell voltage as a function of time in the double-pass E-O shutter of FIG. 2 schematically illustrating selection of a seed-pulse for amplification, acceptance of the amplified seed-pulse for delivery to the first-amplifier stage of FIG. 1, and disposal of a subsequent seed-pulse.

FIG. 2B schematically illustrates the manner in which an amplified seed-pulse is selected for delivery from the fast E-O shutter. Here it is assumed that every $25^{th}$ one of the seed-pulse lasers is picked from the train thereof from the seed laser and delivered to the multi-pass amplifier, and seed-pulse $SP_{N+25}$ is delivered to provide a corresponding amplified pulse $AP_{N+25}$ for delivery to the transient amplifiers. In order to realize this, HV is applied to the Pockels cell for the long duration $D_L$ such that the polarization-orientation of AP is rotated by the Pockels cell from S-polarized, to P-polarized. This provides that amplified pulse is transmitted by polarizing beam-splitter 34 and by polarizing beam-splitter 14 to the transient amplifier stages. This provides the above described fast process shutter function of the above described prior-art MOPA and eliminates the need for a separate such shutter. The delivery form of the amplified seed-pulses can be regular or irregular, and need not correspond to the delivery rate of picked seed-pulses to the multi-pass amplifier, while still providing that each seed-pulse delivered for further amplification has the same amplitude.

In general terms, duration $D_L$ is preferably equal to about the reciprocal of the seed-pulse laser PRF and the rise-time, and in particular the fall time, of the HV pulses, long or short, should be less than the delay time $D_R$ between a delivered seed-pulse and a corresponding returned amplified seed-pulse. This will provide, with proper synchronization of the Pockels cell switching, that the operation of FIG. 2A can be accomplished without pulse $AP_N$ being "intercepted" by the falling edge of the HV pulse; and that the operation of FIG. 2B can be accomplished without pulse $AP_{N+25}$ and seed-pulse $SP_{N+26}$ being intercepted by the falling edge of the longer HV pulse.

In specific terms, if the seed-pulse PRF from the seed-pulse laser is the above-exemplified 50 MHz, then $D_L$ should be about 20 nanoseconds (ns). Picking every $25^{th}$ seed-pulse for amplification will correspondingly require that the Pockels cell can be switched at a rate of 2 MHz which is possible with currently available HV power supplies and switches. Switching rise and fall times of less than 6 ns are possible with such switches.

Figures 3A, 3B:
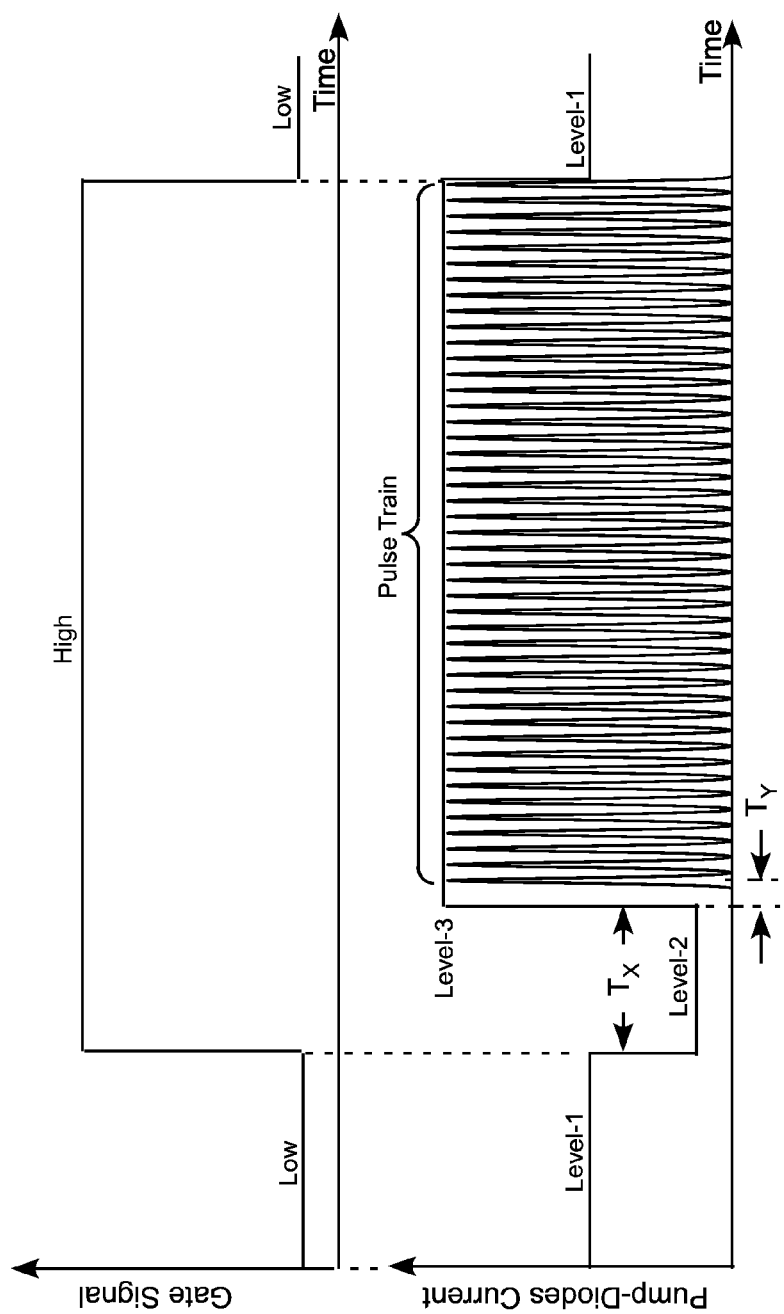
FIG. 3A and FIG. 3B schematically illustrate, in timing diagram form, a pump modulation scheme in accordance with the present invention for preventing first pulse over-amplification in the transient amplifier stages of FIG. 1.

Given above discussed exemplary seed-pulses of between about 60 nanojoules (nj) and about 90 nj pulse-energy and about 10 ps pulse-duration, and with multi-pass amplifier 20 having a $NdYVO_4$ gain-element between about 12 millimeters (mm) and about 30 mm long and pumped with between about 25 Watts (W) and about 80 W of pump radiation, amplified seed-pulses having a pulse-energy of between about 10 microjoules (mj) and 200 mj, and equal amplitude of up to 20 W, will be delivered from fast E-O shutter 16 for further amplification in transient amplifiers 24 and 26 as depicted in FIG. 1. Each transient amplifier must be configured to at least avoid over-amplification of a first pulse in a train in order to retain the benefit of equal-amplitude amplified seed-pulses provided by fast E-O shutter 16 in combination with multi-pass amplifier 20. A method in accordance with the present invention for first-pulse suppression for the transient amplifiers is pump-modulation. In this method an amplifier gain-element is pumped at a lower-than-consistent level for some time interval prior to the arrival of a first pulse, then restored to the consistent level, beginning at some interval immediately before the arrival of the first pulse in the train. The pump-power is then retained at the consistent level for amplification of the first and all other pulses in the train. This is illustrated in timing-diagram form in FIG. 3A and FIG. 3B FIG. 3A schematically illustrates a binary gate-signal used to request delivery of amplified seed pulses, as discussed above with reference to the inventive combination of fast E-O shutter 16 and multi-pass amplifier 20. The gate-signal is at digital low when pulses are not being requested and digital high when pulses are being requested. With the gate-signal at low, the gain element of a transient amplifier is pumped at a level (Level-1 in FIG. 3B) sufficient to maintain the gain element at a temperature which is the same as the temperature during pulses delivery. This is to keep thermal lensing by the gain-element constant. Note that 3B depicts pump-diode current as a function of time. Further, it is noted that the spikes shown in FIG. 3B under pulse train are intended to show the pulse train being generated during the period when the current supplied to the pump diodes is at Level-3.

Continuing with reference to FIG. 3A and with reference in addition to FIG. 3B, when the gate-signal goes high to request pulse-delivery, the pump-power (diode-current) is switched to a lower level (Level 2) for a time period $T_X$. This power level is sufficient to keep the pump-diodes lasing but at a level low enough that stored energy in the gain-element is significantly depleted. It is also possible to lower the power below lasing threshold for the diodes. Time $T_X$ is short enough that no significant temperature change in the gain-element occurs, but long enough to provide the required depletion of stored energy in the gain-element. In terms of the above example of pulse power and repetition rate, $T_X$ is about 100 microseconds (μs).

At a time $T_Y$ before the arrival at the amplifier of the first pulse in a train to be amplified, the pump-power is switched to a level which provides for constant amplitude of amplified pulses. $T_Y$ is selected such that the stored energy in the gain-element will be at a level at which the stored energy will be on arrival of all subsequent pulses. Time $T_Y$ can be calculated, or simply determined by experiment, for any particular level-3 pump-power and PRF of pulses in the pulse train.

Figure 4:
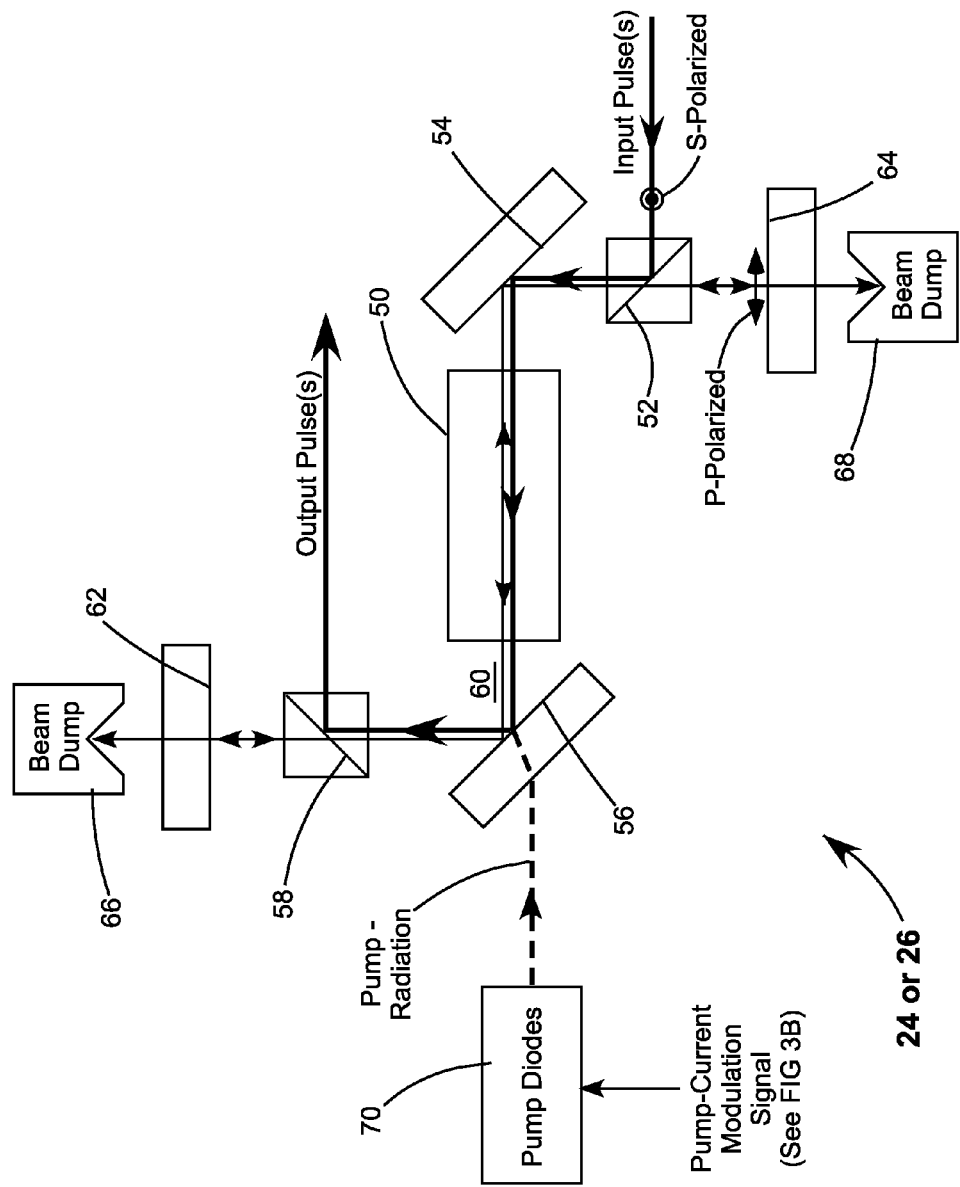
FIG. 4 schematically illustrates one example in accordance with the present invention of a transient amplifier stage of FIG. 1 configured for reducing residual pulse leakage from the amplifier stage.

While the above-described pump-modulation method is highly effective for avoiding over amplification of the first pulse in a train thereof, the method has a disadvantage in that residual pulse leakage from the amplifier is increased, absent any measures to reduce such leakage. Residual pulse leakage is primarily amplifier output resulting from amplification of uncontrolled small picosecond pulses from the multi-pass amplifier. These pulses can occur, for example as a result of incomplete blockage of seed pulses or amplified seed-pulses by polarizing beam-splitters fast optical shutter 16. This leakage is not depicted in FIG. 3B for simplicity of illustration. A transient amplifier in accordance with the present invention configured for reducing such residual pulse leakage is schematically illustrated in FIG. 4.

Here, a transient amplifier is depicted, which can be either transient amplifier 24 or transient amplifier 26 of FIG. 1. This amplifier includes a gain-element which is continuously pumped by pump-radiation from array 70 of diode-lasers. These diode-lasers are operable responsive to a pump-current modulation signal, as depicted in 3B, for preventing over-amplification of a first pulse in a train thereof to be amplified. The pump-radiation is delivered through a dichroic mirror 56 which is highly reflective at the pulse-wavelength, i.e., the emission wavelength of the gain element, and highly transmissive for the wavelength of the pump-radiation.

Input pulses to be amplified are S-polarized with respect to a polarizing beam-splitter 52, and accordingly, are reflected by that beam-splitter. The pulses are then reflected by a turning mirror 54 through gain-element 50 for amplification. Amplified pulses exit gain-element 50 and are reflected by dichroic mirror 56 and another polarizing beam-splitter 58 out of the amplifier, either as output pulses of MOPA 10, or to a further transient amplifier stage.

A laser resonator 60 is formed between end mirrors 62 and 64. When pulses are not being amplified, this causes lasing in the laser resonator. Laser radiation in the resonator is caused to be P-polarized with respect to the beam-splitter surfaces due to the presence of the beam-splitters. Both mirrors 62 and 64 are partially transparent, allowing CW laser output from each end of resonator 60. The output radiation is caught by beam dumps 66 and 68. Output at both ends of resonator 60 is advantageous in that radiation is dumped at two different locations, thereby distributing heat load in the amplifier. Dumping at only one end of resonator 60 is possible with good thermal management. When CW laser radiation is being generated, thereby extracting gain from the gain-element, residual pulse leakage along the pulse output path is eliminated (or greatly reduced). When pulses are being amplified, gain in element 50 is depleted below threshold for the CW lasing, and the CW lasing stops. This arrangement is particularly suited for a gain-element of $YVO_4$ which has a much higher gain in one crystal plane than in a crystal plane at 90° to that plane. In this case, the strong-gain plane of the gain-element (crystal) is aligned with the polarization-plane of the pulses being amplified.

Figure 5:
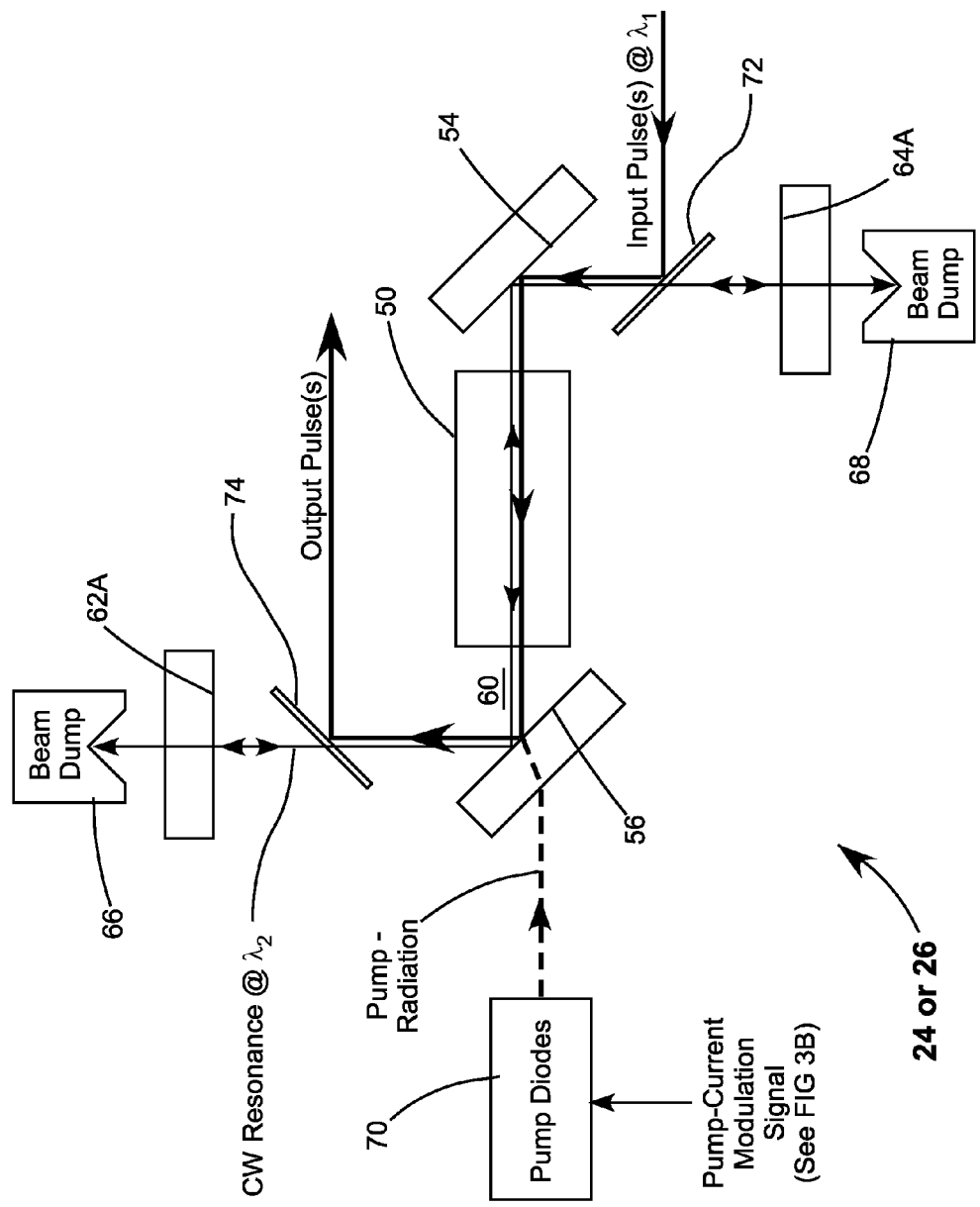
FIG. 5 schematically illustrates another example in accordance with the present invention of a transient amplifier stage of FIG. 1 configured for reducing residual pulse leakage from the amplifier stage.

FIG. 5 schematically illustrates an alternate arrangement of either amplifier 22 or amplifier 24. This arrangement is similar to the arrangement of FIG. 4 with an exception that, when pulses are not being amplified CW lasing is established at a gain-wavelength ($\lambda_2$) of element 50 different from the wavelength ($\lambda_1$) of the pulses to be amplified. By way of example, Nd:$YVO_4$ has a gain-line at a wavelength of 1342 nm. This line has a lower emission cross-section (weaker gain) than at the primary line of 1064 nm. In the transient amplifier arrangement FIG. 5, dichroic mirrors 72 and 74 replace the polarizing beam-splitters of the amplifier arrangement of FIG. 4. These dichroic mirrors are reflective at the pulse (strong-gain) wavelength and highly transmissive at the weak-gain wavelength. End mirrors 62A and 64A, which are partially reflective and partially transmissive, at the weak-gain wavelength, replace end mirrors 62 and 64 of the amplifier arrangement of FIG. 4. When pulses are not being amplified, CW lasing occurs in resonator 60 at the weak-gain wavelength, thereby extracting gain for element 50 and suppressing residual pulse leakage along the pulse-output path. It is also possible to create a laser-resonator including gain-element 50 by coating mirrors directly on the ends of the gain-element.

The amplifier arrangements of FIG. 4 and FIG. 5 are two preferred pulse-amplifier arrangements in accordance with the present invention configured for separately suppressing residual pulse leakage, and prevent first-pulse over-amplification. Other possible arrangements include arranging the resonator axis path at an angle to the amplified pulse path for separating the two paths, and using a dumped CW beam from one amplifier stage to extract gain from the gain-element in a subsequent amplifier stage. Dumped amplified seed-pulses from the E-O shutter may also be used for gain-extraction. From the description presented herein, those skilled in the art may devise other configurations for separately suppressing residual pulse leakage and preventing first-pulse over-amplification without departing from the spirit and scope of the present invention.

Figure 6:
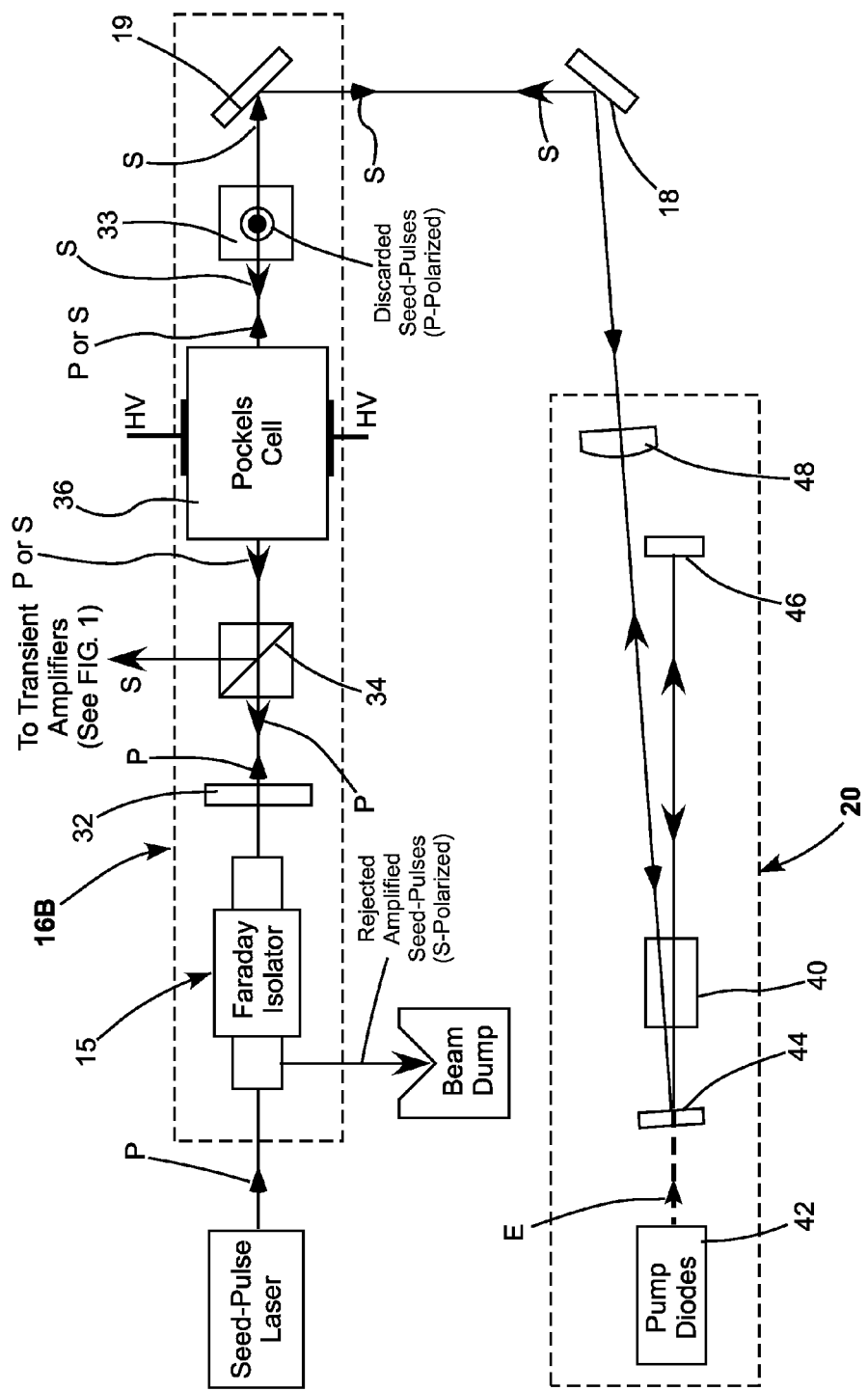
FIG. 6 schematically illustrates details of another preferred arrangement of the fast double-pass E-O shutter and multi-pass amplifier of FIG. 1, similar to the arrangement of FIG. 2, but wherein the Faraday rotator is replaced by a Faraday isolator.

Continuing now with a description of other embodiments of the inventive MOPA, in particular another arrangement of the fast EO-shutter, FIG. 6 schematically illustrates details of another preferred arrangement of the fast double-pass E-O shutter and multi-pass amplifier of FIG. 1, similar to the arrangement of FIG. 2, but wherein Faraday rotator 30 is omitted and replaced by a Faraday isolator. The combination of Faraday isolator 15 and half-wave plate 32 is arranged to provide net zero polarization-rotation for forward propagating seed-pulses. The Pockels cell is configured to provide net zero polarization-rotation in the no (or low) HV applied state. In this state, the polarization-plane of seed-pulses is not rotated and the seed-pulses (P-polarized) are reflected out of the shutter by polarizing beam-splitter 33.

When operated by the long or short HV pulse duration switching method of FIGS. 2A and 2B, the long duration ($D_L$) pulse is used for admitting a seed-pulse to amplifier 20 and discarding the corresponding amplified seed-pulse. With this HV pulse applied, the Pockels cell provides net 90° polarization rotation; the seed-pulse is transmitted through beam-splitter 33 to the amplifier. The corresponding, S-polarized amplified seed-pulse returns through beam-splitter 33 and becomes P-polarized on passing through the Pockels cell. The pulse passes through beam-splitter 34, to be rejected by Faraday isolator 15.

The short duration ($D_S$) HV pulse is applied to the Pockels cell for admitting a seed-pulse to amplifier 20 and delivering the corresponding amplified seed-pulse to the transient amplifiers. With this short-duration HV pulse applied to the Pockels cell, the seed-pulse is 90° polarization-rotated and transmitted through beam-splitter 33 to the amplifier. The corresponding, S-polarized amplified seed-pulse returns through beam-splitter 33 and passes the Pockels cell without polarization rotation. The S-polarized amplified seed-pulse is reflected out of shutter 16B to the transient amplifiers by beam-splitter 34.

From the description present above, those skilled in the art may devise other arrangements of the optical shutter and amplifier combination. Such arrangements may include using an acousto-optic switch (driven by high RF-voltage) in place of the Pockels cell, but probably with inferior performance. These and any other arrangements may be adopted without departing from the spirit and scope of the present invention. A description of alternate binary switching scheme for fast optical shutter 16 and above-described embodiments thereof is set forth below with reference to FIG. 7A and FIG. 7B.

Figures 7A, 7B:
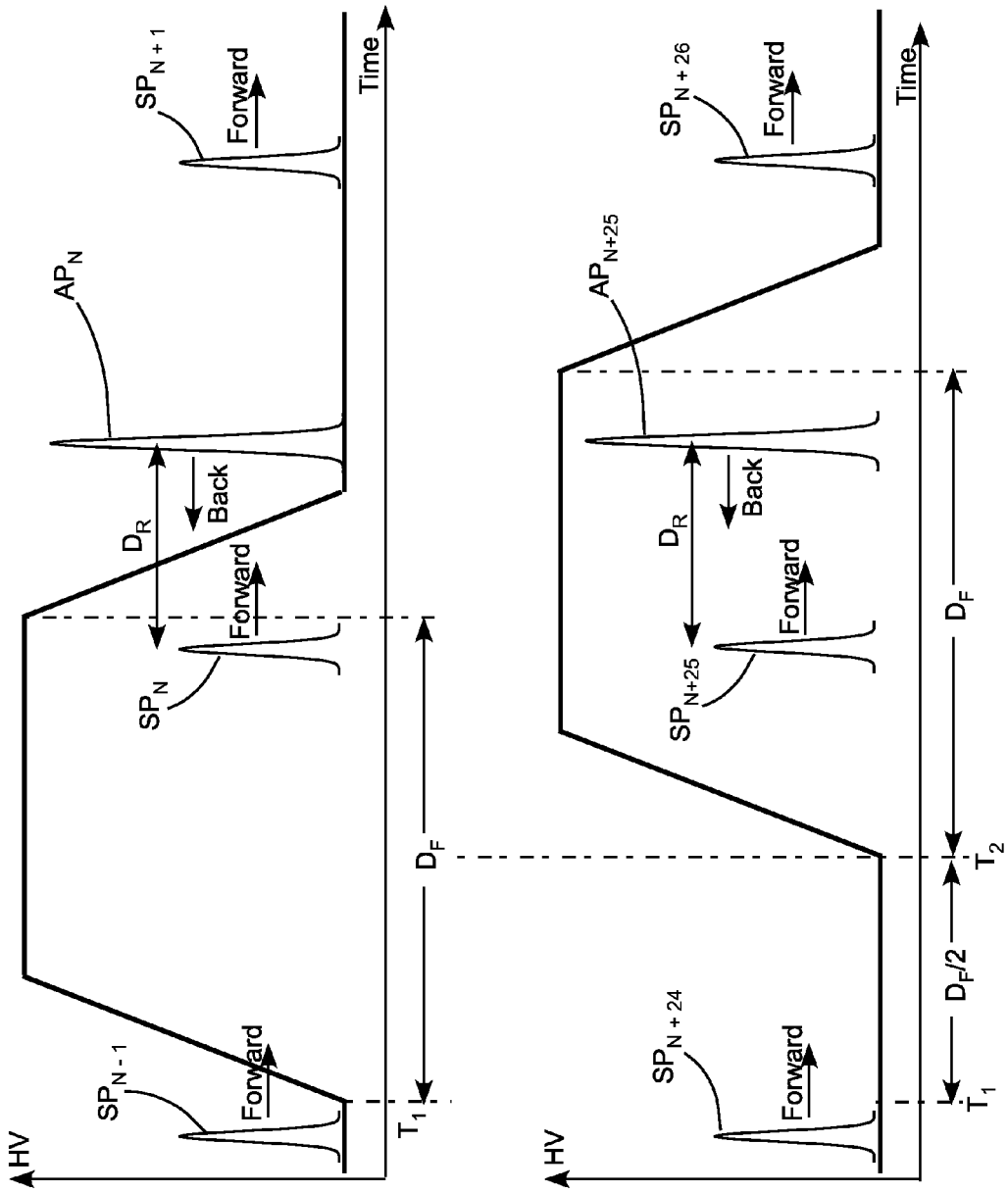
FIG. 7A and FIG. 7B are graphs of voltage as a function of time, schematically illustrate an alternate mode of switching the Pockels cell or the A-O modulator in the arrangements of FIG. 2, and FIG. 6

The alternative binary switching scheme carries out the operations of FIGS. 2A and 2B, but with the alternative short-duration and long-duration HV pulses replaced by a pulse of a long fixed duration ($D_F$) switched at one of two time periods ($T_1$ and $T_2$) following receipt of a seed-pulse from laser 12 of FIG. 1. FIG. 7A schematically illustrates the fixed-duration ($D_F$) pulse applied (switched-on) with time $T_1$ immediately following seed-pulse $SP_{N-1}$. Seed-pulse $SP_N$ traverses the Pockels cell while the HV pulse is applied and amplified seed-pulse $APN$ returns after the HV pulse has been switched off. In the arrangement of FIG. 2, this would be used for picking every $M^{th}$ pulse from the input train for transmission to amplifier 20, but preventing the corresponding amplified-seed-pulse from being transmitted to the transient amplifiers. In the arrangement of FIG. 6 this would be used for sending a seed-pulse to amplifier 20 and transmitting the corresponding amplified seed-pulse to the transient amplifiers FIG. 7B schematically illustrates the fixed-duration ($D_F$) pulse applied (switched-on) with time $T_2$ following seed-pulse $SP_{N+24}$ by an arbitrarily-selected time $D_F/2$. This arbitrary switching time is long enough that seed-pulse $SP_{N+25}$ and corresponding amplified seed-pulse $AP_{N+25}$ traverse the Pockels cell while the HV pulse is applied, but short enough that the seed-pulse $SP_{N+26}$ traverses the Pockels cell after the HV pulse has been switched off. In the arrangement of FIG. 2, this would be used for transmitting a seed-pulse to amplifier 20 and providing the corresponding amplified-seed-pulse is transmitted to the transient amplifiers. In the arrangement of FIG. 6, this would be used for picking every $M^{th}$ pulse from the input train for transmission to amplifier 20, but preventing the corresponding amplified-seed-pulse from being transmitted to the transient amplifiers.

In summary, the present invention is described above in terms of a preferred and other embodiments. The invention is not limited, however, to the embodiments described and depicted herein. Rather, the invention is limited only to the claims appended hereto.

What is claimed is:

1. Optical apparatus comprising:
   a mode-locked laser delivering a first train of pulses at a first pulse-repetition frequency (PRF);
   at least one transient optical amplifier having a solid-state gain-element optically pumped by radiation output from a diode-laser array for energizing the gain-element, the diode laser array having selectively variable output power;
   a multi-pass optical amplifier;
   an optical shutter arranged to select pulses from the first train thereof to provide a second train of pulses at a second PRF less than the first PRF, provide the selected pulses to the multi-pass amplifier to be amplified, receive a corresponding train of amplified pulses from the multi-pass amplifier and selectively transmit a plurality of pulses from the train of amplified pulses to the transient optical amplifier for further amplification, with pulses in the plurality thereof having about equal amplitude;
   wherein the diode-laser array power is set at a first level when amplified pulses are not being received to maintain about constant thermal lensing in the gain-element, set at a second level lower than the first level for a predetermined first time period in response to the plurality of pulses being selected for depleting stored energy in the gain-element, and set to a third level higher than the first level for a second time period prior to the arrival of the plurality of amplified pulses from the optical shutter to restore stored energy in the gain-element, with the first and second time periods being selected such that, when further amplified, all further-amplified pulses in the plurality thereof have about equal amplitude; and
   wherein the transient amplifier has a laser resonator including the gain-element, the laser-resonator generating CW radiation in response to the first-level pumping when amplified pulses are not being further amplified.

2. The apparatus of claim 1, wherein the optical shutter includes a Pockels cell operable alternatively by a first high-voltage signal of a first duration or a second high-voltage signal of a second duration longer than the first duration, and wherein the Pockels cell is operated by either the first or second high-voltage signal to select pulses from the first train thereof to provide the second train of pulses at the second PRF to the multi-pass amplifier, and operated by the second high voltage signal to transmit the plurality of pulses from the train of amplified pulses to the transient optical amplifier for further amplification.

3. The apparatus of claim 2, wherein the optical shutter includes a first polarizing beam-splitter in the path of the first train of pulses to the Pockels cell and a second polarizing beam-splitter in the path of the first train of pulses from the Pockels cell to the multi-pass amplifier.

4. The apparatus of claim 3, wherein if when the Pockels cell is not operated by any of the first and second high-voltage signals pulses from the first train thereof are transmitted by the second polarizing beam-splitter and not provided to the multi-pass amplifier.

5. The apparatus of claim 3, wherein when the Pockels cell is operated by any one of the first and second high-voltage signals, pulses from the first train thereof are reflected by the second polarizing beam-splitter and provided to the multi-pass amplifier.

6. The apparatus of claim 5, wherein when the Pockels cell is operated by the first high-voltage signal amplified pulses are reflected by the first polarizing beam splitter and not transmitted for the further amplification, and when the Pockels cell is operated by the second high-voltage signal amplified pulses are transmitted by the first polarizing beam-splitter to the transient amplifier for the further amplification.

7. The apparatus of claim 1, wherein the optical shutter includes a Pockels cell operable alternatively by a first high-voltage or a second high-voltage signal, with each signal having the same duration, but with second high voltage signal initiated later than the first signal by an amount less than the signal duration, and wherein the Pockels cell is operated by either the first or second high-voltage signal to select pulses from the first train thereof to provide the second train of pulses at the second PRF to the multi-pass amplifier, and operated by the second high voltage signal to transmit the plurality of pulses from the train of amplified pulses to the transient optical amplifier for further amplification.

8. The apparatus of claim 7, wherein the optical shutter includes a first polarizing beam-splitter in the path of the first train of pulses to the Pockels cell and a second polarizing beam-splitter in the path of the first train of pulses from the Pockels cell to the multi-pass amplifier.

9. The apparatus of claim 8, wherein if when the Pockels cell is not operated by any of the first and second high-voltage signals, pulses from the first train thereof are transmitted by the second polarizing beam-splitter and not provided to the multi-pass amplifier.

10. The apparatus of claim 8, wherein when the Pockels cell is operated by any one of the first and second high-voltage signals, pulses from the first train thereof are reflected by the second polarizing beam-splitter and provided to the multi-pass amplifier.

11. The apparatus of claim 10, wherein when the Pockels cell is operated by the first high-voltage signal amplified pulses are reflected by the first polarizing beam splitter and not transmitted for the further amplification, and when the Pockels cell is operated by the second high-voltage signal amplified pulses are transmitted by the first polarizing beam-splitter to the transient amplifier for the further amplification.

12. The apparatus of claim 1, wherein the optical shutter includes a Pockels cell operable alternatively by a first high-voltage signal of a first duration or a second high-voltage signal of a second duration longer than the first duration, and wherein the Pockels cell is operated by either the first or second high-voltage signal to select pulses from the first train thereof to provide the second train of pulses at the second PRF to the multi-pass amplifier, and operated by the first high voltage signal to transmit the plurality of pulses from the train of amplified pulses to the transient optical amplifier for further amplification.

13. The apparatus of claim 12, wherein the optical shutter includes a Faraday isolator, a half-wave plate, and first polarizing beam-splitter in the path of the first train of pulses to the Pockels cell, and a second polarizing beam-splitter in the path of the first train of pulses from the Pockels cell to the multi-pass amplifier.

14. The apparatus of claim 13, wherein if when the Pockels cell is not operated by any of the first and second high-voltage signals, pulses from the first train thereof are reflected by the second polarizing beam-splitter and not provided to the multi-pass amplifier.

15. The apparatus of claim 13, wherein when the Pockels cell is operated by any one of the first and second high-voltage signals, pulses from the first train thereof are transmitted by the second polarizing beam-splitter and provided to the multi-pass amplifier.

16. The apparatus of claim 15, wherein when the Pockels cell is operated by the second high-voltage signal amplified pulses are transmitted by the first polarizing beam-splitter through the half-wave plate to the Faraday isolator and directed by the Faraday isolator out of the optical shutter, and when the Pockels cell is operated by the first high-voltage signal amplified pulses are reflected by the first polarizing beam-splitter to the transient amplifier for the further amplification.

* * * * *